(12) United States Patent
Lee et al.

(10) Patent No.: US 7,606,336 B2
(45) Date of Patent: Oct. 20, 2009

(54) VITERBI DECODER USING CIRCULATION TYPE DECODING UNITS CONNECTED IN PARALLEL

(75) Inventors: Jeong-won Lee, Seongnam-si (KR);
Hyong-suk Kim, Jeonju-si (KR);
Hong-rak Son, Jeonju-si (KR);
Hyun-jung Kim, Jeonju-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 622 days.

(21) Appl. No.: 11/342,566

(22) Filed: Jan. 31, 2006

(65) Prior Publication Data

US 2006/0171490 A1  Aug. 3, 2006

(30) Foreign Application Priority Data

Feb. 1, 2005 (KR) .................... 10-2005-0009216

(51) Int. Cl.
*H04L 27/06* (2006.01)
(52) U.S. Cl. .................. 375/341; 714/794; 714/795
(58) Field of Classification Search .......... 375/341; 714/794, 795
See application file for complete search history.

(56) References Cited

U.S. PATENT DOCUMENTS

| | | | | |
|---|---|---|---|---|
| 5,384,809 A | * | 1/1995 | Yagi et al. .................. | 375/261 |
| 5,787,121 A | * | 7/1998 | Okamoto .................... | 375/262 |
| 6,999,521 B1 | * | 2/2006 | Azadet et al. .............. | 375/262 |
| 7,206,363 B2 | * | 4/2007 | Hegde et al. ............... | 375/341 |
| 7,245,638 B2 | * | 7/2007 | Agazzi et al. .............. | 370/516 |
| 2002/0199154 A1 | * | 12/2002 | Son et al. ................... | 714/795 |
| 2005/0060633 A1 | * | 3/2005 | Parhi et al. ................. | 714/795 |

FOREIGN PATENT DOCUMENTS

| | | |
|---|---|---|
| JP | 03-242027 | 10/1991 |
| KR | 1020020096621 A1 | 12/2002 |

OTHER PUBLICATIONS

Fettweis, "High-Speed Parallel Viterbi Decoding Algorithm and VLSI-Architecture," IEEE Communication Magazine May 1991.*
Cox, "An Efficient Adaptive Circular Viterbi Algorithm for Decoding Generalized Tailbiting Convolutional Codes," IEEE Transactions on Vehicular Technology, vol. 43, No. 1, Feb. 1994, pp. 57-68.*

(Continued)

*Primary Examiner*—Juan A Torres
(74) *Attorney, Agent, or Firm*—Sughrue Mion, PLLC

(57) ABSTRACT

An analog Viterbi decoder for decoding an analog signal is provided that includes a plurality of decoding units, provided with a plurality of processing parts each having a plurality of cells arranged to correspond to respective nodes of a trellis diagram, for decoding analog input data using an analog signal processing cell having a circulation type connection structure in which the last processing part is connected to the first processing part; a control unit for performing in parallel a sequential designation of the processing parts with respect to the decoding units; an analog data storage unit including a plurality of capacitors connected in parallel with the processing parts provided in the decoding units; and a first switch unit for storing analog input data in a specific capacitor of the analog data storage units under the control of the control unit. Accordingly, the decoding speed can be remarkably improved.

7 Claims, 5 Drawing Sheets

OTHER PUBLICATIONS

Black, "A hardware efficient parallel Viterbi algorithm", 1990 International Conference on Acoustics, Speech, and Signal Processing, 1990. ICASSP-90, Apr. 3-6, 1990 pp. 893-896 vol. 2.*

Anderson, "An optimal circular Viterbi decoder for the bounded distance criterion" IEEE Transactions on Communications, vol. 50, Issue 11, Nov. 2002 pp. 1736-1742.*

* cited by examiner

VITERBI DECODER USING CIRCULATION TYPE DECODING UNITS CONNECTED IN PARALLEL

This application claims priority from Korean Patent Application No. 10-2005-0009216, filed on Feb. 1, 2005 in the Korean Intellectual Property Office, the entire disclosure of which is incorporated herein by reference.

BACKGROUND OF THE INVENTION

1. Field of the Invention

The present invention relates to a Viterbi decoder for decoding data using a trellis diagram, and more particularly to a Viterbi decoder for decoding data using circulation type decoding units connected in parallel.

2. Description of the Related Art

Due to the recent development of communication technology, wireless mobile communication technology has spread worldwide. In a wireless mobile communication environment, data is wirelessly transmitted and received, and thus it is difficult for a receiving side to accurately receive the data transmitted from a transmitting side. In other words, in a data transmission process, the data that is received may be distorted due to the effect of noise and other factors. In order to reduce the distortion, the transmitting side typically encodes the data to be transmitted and the receiving side decodes the encoded data that is received. In addition, the coding and decoding processes are performed in storing data on a recording medium, such as a Digital Versatile Disk (DVD).

Various coding methods have been employed, such as a block coding method, a convolution coding method, and others. The block coding method is a coding method that includes additional data of specified bits in input data bits and encodes the input data. The convolution coding method is a coding method that stores previously input data using a memory and encodes the data based on a correlation between the present input value and the previous input value. The convolution coding method has an excellent error correction efficiency in comparison to the block coding method, and thus it has been generally used.

A Viterbi decoder decodes data that has been coded by the convolution coding method. The Viterbi decoder corrects an error by determining an optimal path from a resultant value that is accumulated through a multistage operation.

FIG. 1 is an exemplary view illustrating a trellis diagram used in a general Viterbi decoder. In the trellis diagram illustrated in FIG. 1, a constraint length is 3 and a coding rate is 1/2. Since the constraint length is 3, the previously input value may be in four states, such as 00, 10, 01, and 11. The Viterbi decoder performs back-tracking of the optimal path that corresponds to the minimum accumulated distance value after a specified time, using a difference between an inherent code allocated to each branch of the trellis diagram and an actually input value as a distance value (e.g., metric). Specifically, if the optimal path passes a branch indicated as a solid line of the trellis diagram, the Viterbi decoder decodes it with "0", while if the optimal path passes a branch indicated as a dotted line, the decoder decodes it with "1". Accordingly, it is possible to correct an error even if there is a difference between the received signal and the transmitted signal.

Meanwhile, respective nodes a, b, c and d on the trellis diagram calculate the shortest distances to a destination using Equation (1).

$$D_{i,j} = \min\{D_{k,l} + d_{ij,kl}, (k,l) \in S(i,j)\} \quad \text{Equation (1)}$$

In Equation (1), $D_{k,l}$ is the shortest distance from a cell (k, l) to a destination, $d_{ij,kl}$ is a local distance between a cell (i,j) and a cell (k,l), $S(i,j)$ is a set of cells around the cell (i, j), and min is a function that outputs minimum value of enumerated items.

In a conventional Viterbi decoder, all nodes of the trellis diagram are not implemented by hardware, but only nodes corresponding to one column are implemented by hardware. Thus, the nodes perform the operation as expressed in Equation (1) (i.e., an addition of the accumulated distance value transferred from the previous nodes to the distance value of each branch, with the lapse of time, selecting the minimum value among the added values, and then storing the resultant value in a memory).

Accordingly, if the operations are performed until the last destination is reached, the optimal path can be found using data stored in the memory. This operation requires additional hardware such as a memory. In addition, since the back tracking process for the optimal path calculation should be performed in the memory, time for the decoding operation is lengthened.

In order to solve the above-described problems, Korea Patent Registration No. 10-0412934 discloses a circulation type Viterbi decoder in which cells are arranged in places corresponding to the respective nodes of a trellis diagram, and the cells corresponding to the last node are connected with the cells corresponding to the first node. In this circulation type Viterbi decoder, it is not necessary to store output values of the respective cells in a separate memory, and thus additional hardware is not required. Also, since the decoding is performed by sensing a change of the last output pulse after a specified trigger signal is applied to the respective cell, the back tracking process is unnecessary. As a result, the decoding time is reduced. However, the circulation type Viterbi decoder also starts the decoding operation for the next bit after the decoding of one bit is completed, and this causes the decoding speed to be lowered as much as the time required for the decoding of the respective data bits.

SUMMARY OF THE INVENTION

An aspect of the present invention provides a Viterbi decoder which can remarkably improve the data decoding speed by using circulation type decoding units connected in parallel.

The foregoing and other aspects of the present invention are substantially realized by providing a Viterbi decoder which comprises: a plurality of decoding units, provided with a plurality of processing parts each having a plurality of cells that are vertically arranged so as to correspond to respective nodes on a trellis diagram, that decode analog input data using an analog signal processing cell having a circulation type connection structure in which a last processing part is connected to a first processing part; a control unit that performs in parallel a sequential designation of the plurality of processing parts with respect to the plurality of decoding units in accordance with an external input clock signal; an analog data storage unit including a plurality of capacitors connected in parallel with the plurality of processing parts that are provided in the plurality of decoding units; and a first switch unit for storing analog input data in a specific capacitor of the analog data storage unit that is controlled by the control unit.

The plurality of decoding units may receive the analog data stored in the specified capacitor among the plurality of capacitors through specified processing parts provided in the plurality of decoding units and decode the analog data in parallel.

The decoding unit may comprise a cell selection unit that designates a specified cell among the cells of the processing part that is designated by the control unit; a second switch unit, connected to respective processing parts of the analog signal processing cell, that applies a reference input signal to the specified cell that is designated by the control unit and the cell selection unit; a maximum value operation unit that detects a maximum value among output values of the cells if the cells of the processing part that is designated output specified operation values using the reference input signal and an input value that is input from a previous processing part; a third switch unit that detects an output signal of the maximum value operation unit; a signal change sensing unit that senses a change of the output value by monitoring the signal that is output from the third switch unit; and a pulse generation unit that outputs the change of the output value that is sensed by the signal change sensing unit as a pulse signal.

The control unit may select one of even-numbered cells and odd-numbered cells among the cells of the specified processing part that are included in each of the plurality of decoding units and add a specified trigger signal to output values of the selected cells, so that the plurality of decoding units confirm the change of the output value of the third switch unit to perform decoding operation.

BRIEF DESCRIPTION OF THE DRAWINGS

The above and other aspects of the present invention will be more apparent by describing certain exemplary embodiments of the present invention with reference to the accompanying drawings, in which.

Figure 1:
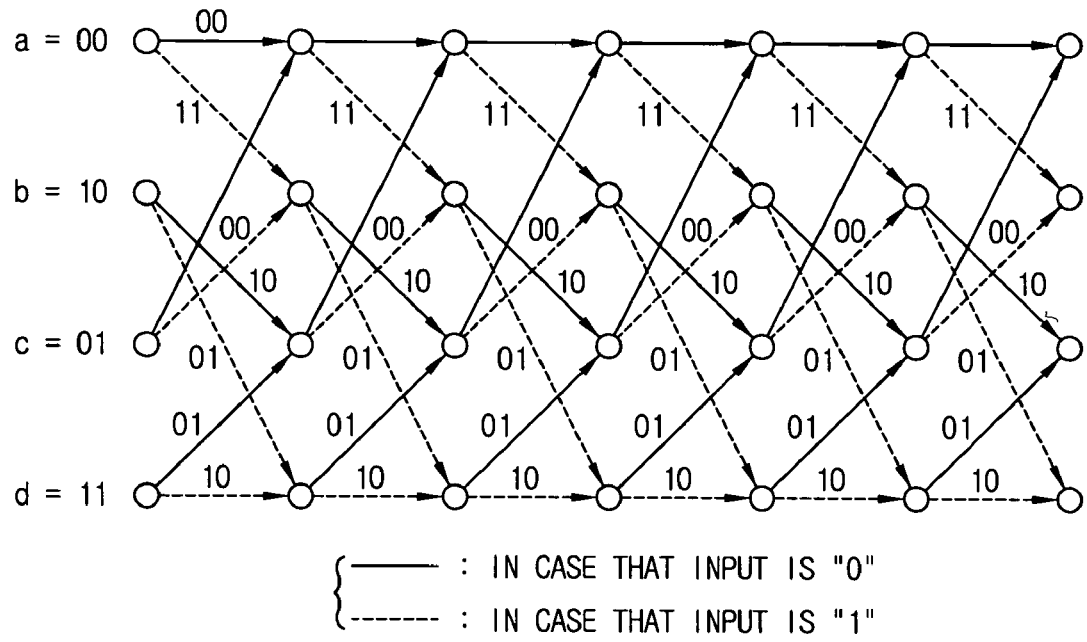
FIG. 1 is an exemplary view illustrating a trellis diagram used in a general Viterbi decoder.

DETAILED DESCRIPTION OF THE
EXEMPLARY EMBODIMENTS OF THE
INVENTION

Exemplary embodiments of the present invention will be described in greater detail with reference to the accompanying drawings.

In the following description, same drawing reference numerals are used for the same elements even in different drawings. The matters defined in the description such as a detailed construction and elements are provided to assist in a comprehensive understanding of the invention. Thus, it is apparent that the present invention can be carried out without those defined matters. Also, well-known functions or constructions are not described in detail since they would obscure the invention in unnecessary detail.

Figure 2:
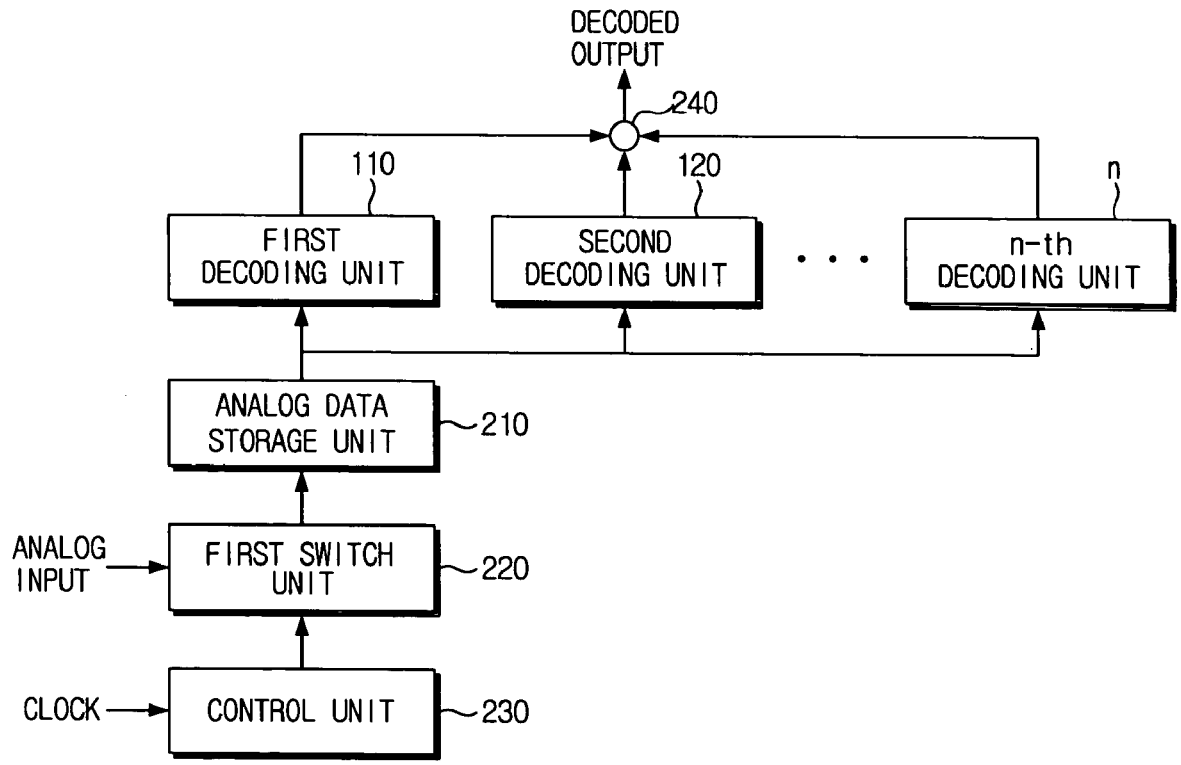
FIG. 2 is a block diagram illustrating the construction of a Viterbi decoder according to an exemplary embodiment of the present invention.

FIG. 2 is a block diagram illustrating the construction of a Viterbi decoder according to an exemplary embodiment of the present invention.

Referring to FIG. 2, the Viterbi decoder includes a first to n-th decoding units 110, 120, . . . , and n, an analog data storage unit 210, a first switch unit 220, a control unit 230, and a decoded data detection unit 240. That is, a plurality of decoding units 110, 120, . . . , and n are included in the Viterbi decoder according to an exemplary embodiment of the present invention.

The analog data storage unit 210 stores external input analog data. Further, the analog data storage unit 210 may include a plurality of capacitors.

The first switch unit 220 performs a switching operation for the storing of the analog data in the analog data storage unit 210. If the analog data storage unit 210 is provided with the plurality of capacitors, as described above, the first switch unit 220 may be provided with a plurality of switches that are connected to each of the capacitors.

The control unit 230 designates a processing part that is included in each of the plurality of decoding units 110, 120, . . . , and n according to a specified external clock signal. The description of the control unit 230 will be provided later.

On the other hand, the analog input data stored in the analog data storage unit 210 is inputted in parallel to the decoding units 110, 120, . . . , and n. Thus, the decoding units 110, 120, . . . , and n perform the decoding operation in parallel. In this case, even-numbered decoding units and odd-numbered decoding units are selected among the decoding units to perform the decoding operation.

The decoding data detection unit 240 sequentially detects data that is sequentially decoded from the decoding units 110, 120, . . . , and n, respectively. Thus, the time required for decoding all of the analog input data is greatly reduced.

Figure 3:
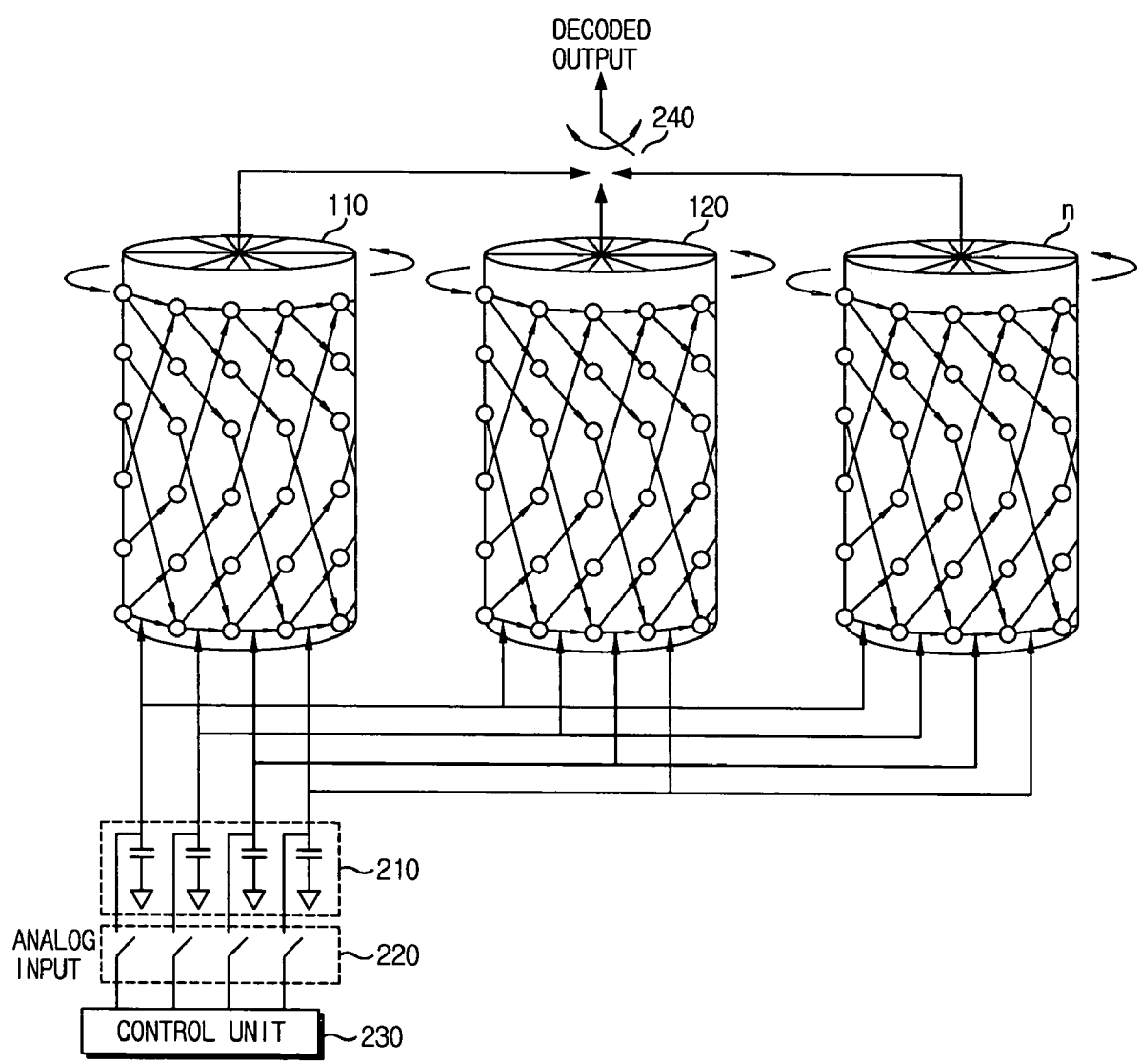
FIG. 3 is an exemplary view illustrating a Viterbi decoder of FIG. 2.

FIG. 3 is an exemplary view schematically illustrating the construction of each of the decoding units 110, 120, . . . , and n in FIG. 2.

Referring to FIG. 3, each of the decoding units 110, 120, . . . , and n includes a plurality of processing parts (i.e., a set of vertically arranged cells). The cells included in each of the processing parts are located at each corresponding node on the trellis diagram. Also, the last processing part among the respective processing parts is connected with the first column to provide a circulation form. In this case, the number of the cells constituting one processing part may be variously set according to the configuration of the Viterbi decoder. FIG. 3 illustrates the case where the cells are arranged so as to correspond to the trellis diagram for a DVD read channel having a constraint length of 3.

The analog data storage unit 210 includes capacitors connected to the respective processing parts of the decoding units 110, 120, . . . , and n. The first switch unit 220 includes a plurality of switches connected to the respective capacitors.

Figure 4:
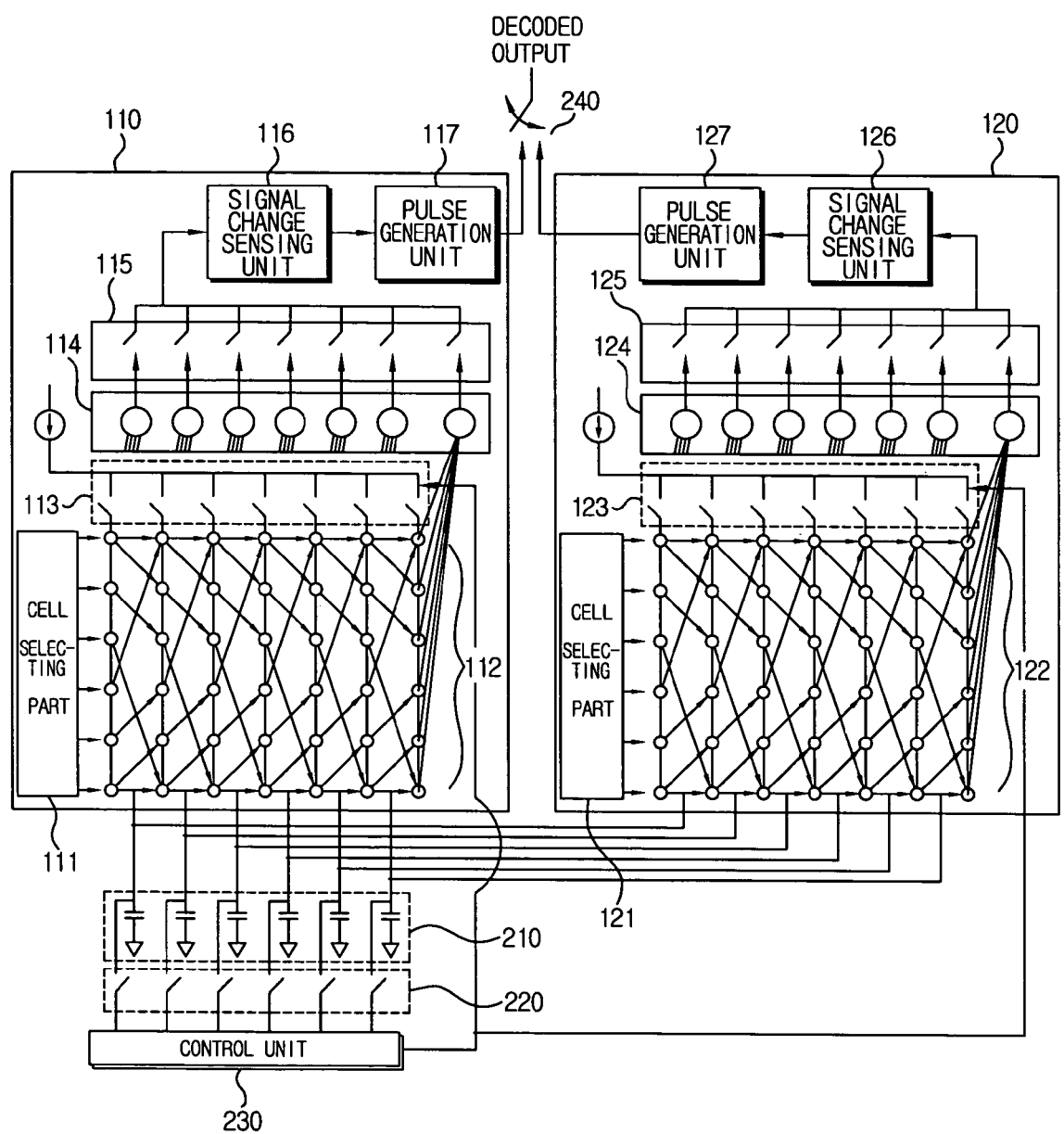
FIG. 4 is a diagrammatic view illustrating the circuit construction of a Viterbi decoder illustrated in FIG. 2.

FIG. 4 is an exemplary view illustrating the detailed construction of a Viterbi decoder according to the exemplary embodiment of the present invention depicted in FIG. 2.

For convenience of explanation, only the first and second decoding units 110 and 120 are illustrated in FIG. 4. The first decoding unit 110 includes a cell selection unit 111, an analog signal processing cell 112, a second switch unit 113, a maximum value operation unit 114, a third switch unit 115, a signal change sensing unit 116, and a pulse generation unit 117.

The analog signal processing cell 112 includes one or more vertically arranged processing parts. The cells in the respective processing parts are located at corresponding nodes on the above described trellis diagram. The last processing part among the plurality of processing parts is connected to the first processing part. The analog signal processing cell 112 may be implemented to be one or two parts longer than the constraint length of the trellis diagram.

The respective cells of the analog signal processing cell 112 can reduce an operational burden by modifying Equation (1). For instance, $y_{k,l}$ may be defined as a value for subtracting $D_{k,l}$ from a reference input signal $I_{ref}$, which is an arbitrary constant value. Accordingly, Equation (1) can be modified as shown by Equation (2).

$$D_{i,j}=I_{ref}-\max\{Y_{k,l}-d_{ij,lk};(k,l)\in S(i,j)\} \quad \text{Equation (2)}$$

In the same manner, $y_{i,j}$ can be represented by $I_{ref}-D_{i,j}$. If $y_{i,j}$ is substituted for Equation (2), then Equation (3) is obtained.

$$y_{i,j}=\max\{Y_{k,l}-d_{ij,kl};(k,l)\in S(i,j)\} \quad \text{Equation (3)}$$

In Equation (3), the operation of the cell has been changed from an addition and a minimum value calculation to a subtraction and a maximum value calculation. Providing that the cell (i,j) at Equation (3) is a destination, the shortest distance $D_{i,j}$ from the cell corresponding to the destination to the cell corresponding to the destination becomes "0". In this case, since $y_{i,j}=I_{ref}-D_{i,j}$, then $y_{i,j}$ becomes $I_{ref}$. By using these properties, Equation (3) is finally modified as Equation (4).

$$y_{i,j}=\max\{u_{i,j},y_{k,l}-d_{ij,kl};(k,l)\in S(i,j)\} \quad \text{Equation (4)}$$

where $u_{i,j}=I_{ref}$; if (i,j) is the cell of the destination, and
$u_{i,j}=0$; if (i,j) is not the cell of the destination.

In other words, if the cell (i,j) is the destination cell, then an output value of the cell obtained by Equation (4) becomes $I_{ref}$. Otherwise, a maximum value obtained as a result of the subtraction is outputted.

The control unit 230 sequentially designates the respective processing parts included in the analog signal processing cell 112 according to an external input clock signal. Specifically, if the present processing part is the j-th processing part, the next input clock designates the (j+1)-th processing part.

The cell selection unit 111 designates a specified cell among the cells that constitute the processing part designated by the control unit 230. If the designated cell performs the operation using Equation 4 after initially designating an arbitrary cell, the next cell is determined according to the resultant value of the operation.

The first switch unit 220 performs a switching operation so as to store the input data in the respective capacitors of the analog data storage unit 210. In this case, the input data is stored in the capacitor connected to the processing part previous to the processing part that is presently designated by the control unit 230. In other words, if the present j-th processing part is designated by the control unit 230, the first switch unit 220 turns on the switch connected with the capacitor of the (j−1)-th processing part to store the analog data. If the next data is inputted, the data is sequentially stored in the next processing part.

Accordingly, if the analog data is stored in all the capacitors, the control unit 230 applies a reference input signal to a specified cell by controlling the second switch unit 113. The cell to which the reference input signal is applied is determined by the control unit 230 and the cell selection unit 111 as described above. Concretely, if the reference input signal is applied to the i-th cell of the j-th processing part, i.e., cell (i, j), the cell performs the operation according to Equation (4). The control unit 230 sequentially designates the next processing part, and the cell selection unit 111 designates a specified cell among the cells that constitute the next processing part using the result value of the operation of the cell (i, j). The reference input signal inputted to the j-th processing part is propagated to the (j−1)-th processing part in real time. As described above, if the operation up to the (j−1)-th processing part is performed, the maximum value operation unit 114 detects the maximum value of the respective cells.

The detected output value from the maximum value operation unit 114 is input to next processing part by the third switch unit 115. The third switch unit 115 performs the switching operation according to the control of the control unit 230, so that the result of the present processing part is output.

The control unit 230 adds a trigger signal in a direction opposite to the reference input signal to the outputs of the odd-numbered and even-numbered cells among the cells of the next processing part. This causes the output signal of the corresponding cell to be reduced, and thus the output signal of the cells is blocked by the next processing part because the cells of the next processing part select the maximum value. If the optimal path for the decoding has passed the blocked branch, the last output value is abruptly decreased due to the addition of the trigger signal. By contrast, if the optimal path has not passed the blocked branch, the last output value is kept as it is. Thus, it can be determined which branch of "0" or "1" the optimal path has passed by confirming of the change of the last output value.

The signal change sensing unit 116 detects the change of the last output value. The pulse generation unit 117 outputs the resultant value of the decoding in the form of a pulse signal by confirming the change of the last output value detected by the signal change sensing unit 116. Accordingly, the decoding of the input analog data is performed.

The second decoding unit 120, like the first decoding unit 110, includes a cell selection unit 121, an analog signal processing cell 122, a second switch unit 123, a maximum value operation unit 124, a third switch unit 125, a signal change sensing unit 126, and a pulse generation unit 127.

The control unit 230 controls the second decoding unit 120 to perform a parallel decoding operation by applying the start point of the selected path and the destination cell different from those for the first decoding unit 110. There are many partially broken connection lines (i.e., branches) between the respective nodes in a partial response maximum likelihood (PRML) trellis diagram. Accordingly, the respective nodes are clearly discriminated from one another, and thus there is no difference in decoding performance even if plural start points of the path are set.

If the first decoding unit 110 starts the decoding of a specified bit of the analog data, the control unit 230 controls the second decoding unit 120 to start the decoding of the next bit. Specifically, the control unit 230 starts the decoding operation by designating the j-th processing part of the first decoding unit 110 and the (j+1)-th processing part of the second decoding unit 120 in a state where the analog data is stored in all the capacitors as described above. Since the decoding operation is the same as the first decoding unit 110, further explanation thereof will be omitted. In addition, since the respective constituent elements of the second decoding unit 120 are same as those of the first decoding unit 110, their explanation will also be omitted.

Figure 5:
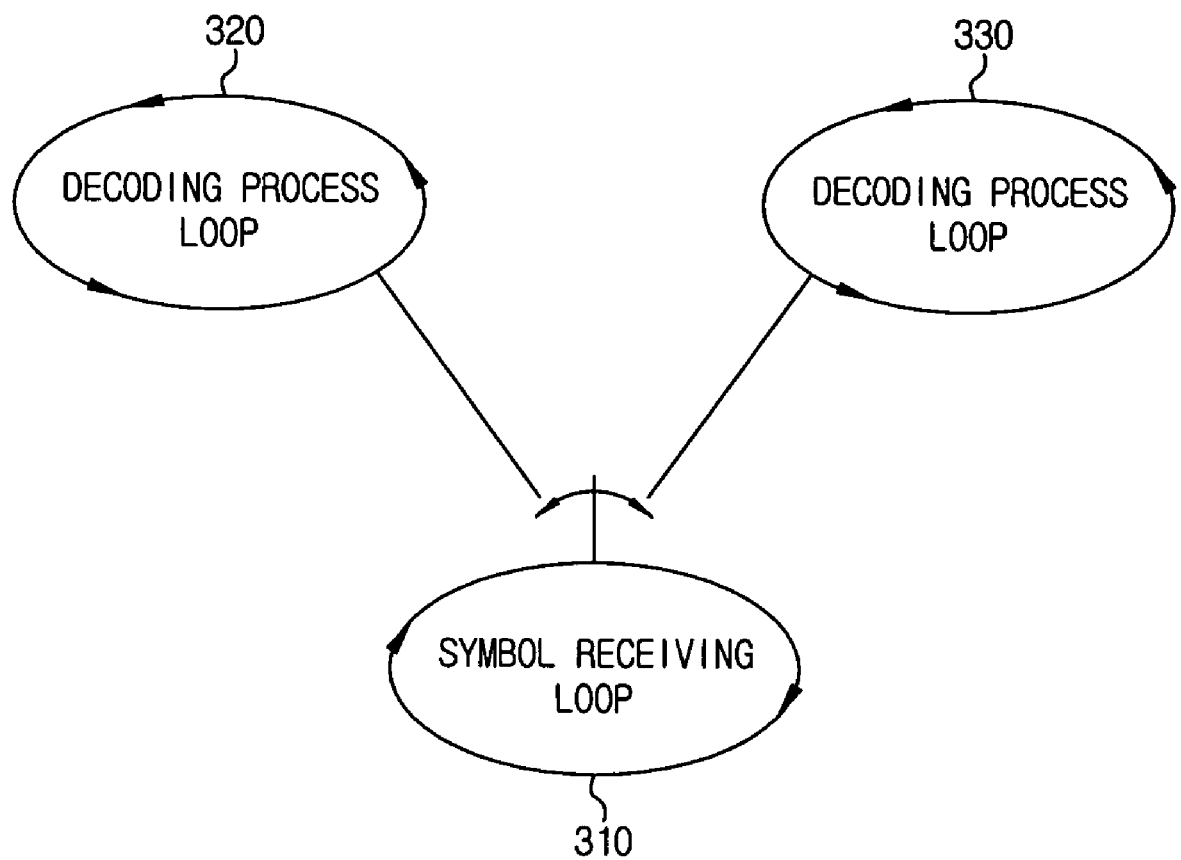
FIG. 5 is an exemplary view of a timing loop explaining a process of improving the decoding speed of a Viterbi decoder according to an exemplary embodiment of the present invention.

FIG. 5 is an exemplary view of an operation loop of the Viterbi decoder as illustrated in FIG. 4.

Referring to FIG. 5, after an analog data input loop (i.e., a symbol receiving loop 310) is executed, plural decoding process loops 320 and 330 are then executed in parallel. In FIG. 5, the total decoding time is calculated as described below. First, the time required for the input loop 310 can be obtained by Equation (5).

$$T_{receiving}=t_{sw1}+t_{charge}+t_{sw2} \quad \text{Equation (5)}$$

In Equation (5), $T_{receiving}$ denotes the total required time for the signal input loop 310, $t_{sw1}$ denotes a switching time for connecting a capacitor in which the analog input data will be stored, $t_{charge}$ denotes the time for charging the capacitor with the analog input data, $t_{sw2}$ denotes a switching time for inputting a signal from the capacitor to the first decoding unit 110 or the second decoding unit 210.

Next, the time required for one decoding process loop 320 can be obtained by Equation (6).

$$T_{decoding} = t_{state} + \sum_{j=1}^{K} \{t_{err}(j) + t_{max}(j)\} + t_{average} + t_{threshold} \qquad \text{Equation (6)}$$

In Equation (6), $T_{decoding}$ denotes the total required time for the decoding process loop 320, $t_{state}$ denotes the time required for deciding a cell to which the reference input signal will be applied, K denotes the total number of the processing parts, $t_{err}$ denotes the time required for subtracting an error value from the reference signal propagated to the respective processing part, $t_{max}$ denotes the maximum operation time in the respective processing part, $t_{average}$ denotes the time required for calculating an average value of the output pulse signal, and $t_{threshold}$ denotes the time required for comparing the average value of the output pulse signal with a threshold value to perform the decoding operation.

On the other hand, as the decoding speed is in reverse proportion to the decoding time, the decoding speed may be expressed by Equation (7).

$$B = \frac{1}{T_{decoding} = t_{state} + \sum_{j=1}^{K} \{t_{err}(j) + t_{max}(j)\} + t_{average} + t_{threshold}} \qquad \text{Equation (7)}$$

According to an exemplary embodiment of the present invention, if the decoding operation is performed in parallel using n decoding units 110, 120, ..., and n, the decoding speed is increased in proportion to the number n of the decoding units. As a result, the decoding speed $B_F$ may be expressed as nB.

Figure 6:
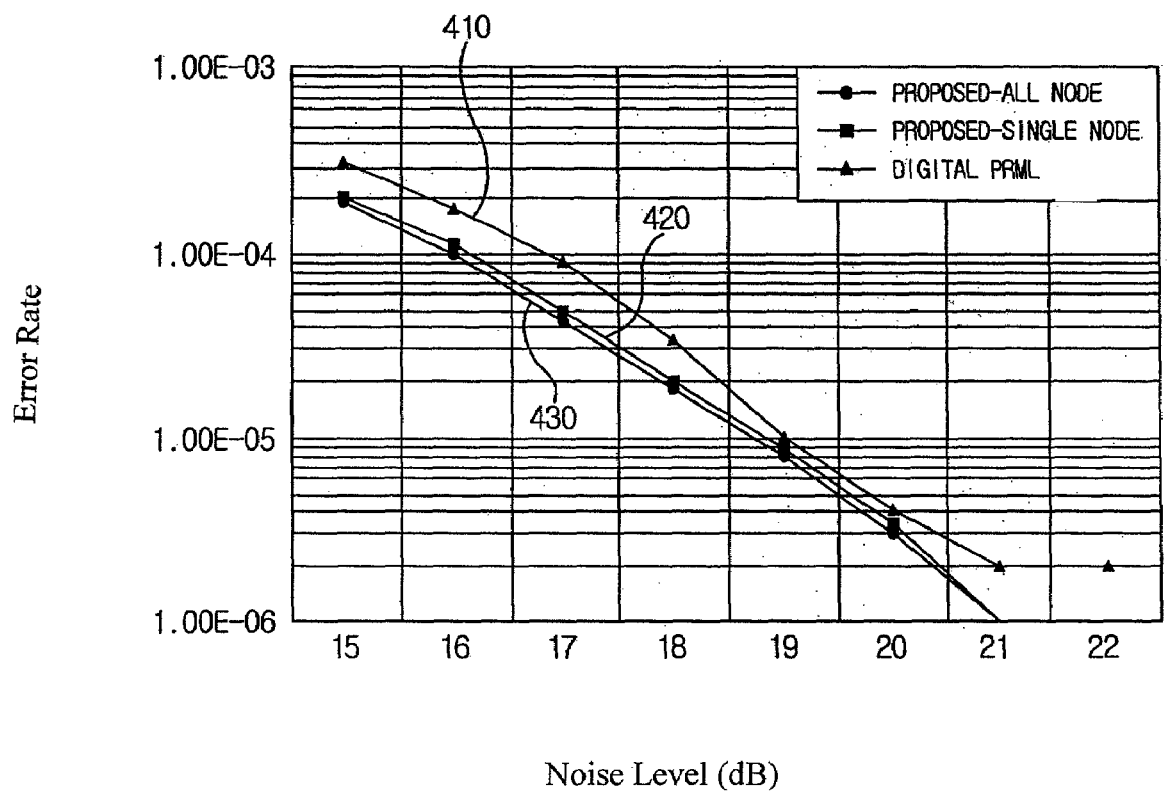
FIG. 6 is an exemplary view illustrating the simulation results for comparing the decoding efficiency of 2-dimensional circulation type decoding units connected in parallel with that of the decoding units separately used.

FIG. 6 is an exemplary view illustrating the decoding efficiency of the decoding units connected in parallel according to an exemplary embodiment of the present invention.

Referring to FIG. 6, the horizontal axis represents a noise level expressed in decibels (dB), and the vertical axis represents an error rate. In FIG. 6, the first line 410 indicates the decoding efficiency of a digital Viterbi decoder that decodes a digital signal. The second line 420 indicates the decoding efficiency of an analog Viterbi decoder that designates only a specific cell as the start point of the path. The third line 430 indicates the decoding efficiency in the case of designating all the cells as the start points of the path in a Viterbi decoder that uses plural decoding units 110, 120, ..., and n connected in parallel according to an exemplary embodiment of the present invention. As shown by the first to third lines 410, 420 and 430, there is no difference in error rate and noise level. Thus, the decoding efficiency would not decrease.

As described above, according to an aspect of the present invention, by using a plurality of decoding units connected in parallel, the decoding speed can be remarkably improved without reducing decoding efficiency.

The foregoing embodiments are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. An analog Viterbi decoder, comprising:
a plurality of decoding units, provided with a plurality of processing parts each having a plurality of cells that are vertically arranged so as to correspond to respective nodes on a trellis diagram, each of the plurality of decoding units decoding analog input data using an analog signal processing cell having a circulation type connection structure in which a last processing part is connected to a first processing part;
a control unit that performs in parallel a sequential designation of the plurality of processing parts with respect to the plurality of decoding units in accordance with an external input clock signal;
an analog data storage unit including a plurality of capacitors connected in parallel with the plurality of processing parts that are provided in the plurality of decoding units; and
a first switch unit that stores analog input data in a specific capacitor of the analog data storage unit that is controlled by the control unit,
wherein the plurality of decoding units comprises a first decoding unit and a second decoding unit, and
wherein the sequential designation of the plurality of processing parts with respect to the plurality of decoding units comprises designating the first decoding unit to start decoding a specified bit of the analog input data using the first processing part of the first decoding unit, and designating the second decoding unit to start decoding a next bit of the analog input data using a second processing part of the second decoding unit, said first and second processing parts being among the plurality of processing parts.

2. The analog Viterbi decoder as claimed in claim 1, wherein the plurality of decoding units receive the analog data that is stored in the specific capacitor among the plurality of capacitors through specified processing parts provided in the plurality of decoding units, and decode the analog data in parallel.

3. The analog Viterbi decoder as claimed in claim 2, wherein the decoding unit comprises:
a cell selection unit that designates a specified cell among the cells of the processing part that is designated by the control unit;
a second switch unit, connected to respective processing parts of the analog signal processing cell, that applies a reference input signal to the specified cell that is designated by the control unit and the cell selection unit;
a maximum value operation unit that detects a maximum value among output values of the cells if the cells of the processing part that is designated output specified operation values using the reference input signal and an input value that is input from a previous processing part;
a third switch unit that detects an output signal of the maximum value operation unit;

a signal change sensing unit that senses a change of the output value by monitoring the signal that is output from the third switch unit; and a pulse generation unit that outputs the change of the output value that is sensed by the signal change sensing unit as a pulse signal.

4. The analog Viterbi decoder as claimed in claim 3, wherein the control unit selects one of even-numbered cells and odd-numbered cells among the cells of the specified processing part that are included in each of the plurality of decoding units and initiates decoding operation from the decoding unit that is selected.

5. The analog Viterbi decoder as claimed in claim 4, wherein cells of a specified processing part that are included in each of the plurality of the decoding units calculate the output value using the following equation, $$y_{i,j} = \max\{u_{i,j}, y_{k,l} - d_{ij,kl}; (k,l) \in S(i,j)\}$$

$$y_{i,j} = I_{ref} - D_{i,j}$$

$u_{i,j} = I_{ref}$; if (i,j) is the cell of the destination $u_{i,j} = 0$; if (i,j) is not the cell of the destination where, $y_{i,j}$ denotes an output value of a cell (i, j), $D_{i,j}$ denotes the shortest distance between the cell (i, j) and a destination cell, $I_{ref}$ denotes a reference input signal value, $d_{i,j,kl}$ denotes a partial distance from the cell (i, j) to a cell (k, l), S(i, j) denotes a set of cells that belong to an identical processing part as the cell (i, j), and max denotes a function that outputs a maximum value among enumerated items.

6. A decoder, comprising:

a plurality of decoding units, provided with a plurality of processing parts each having a plurality of cells that are arranged to correspond to respective nodes on a trellis diagram, each of the plurality of decoding units decoding input data using a signal processing cell having a circulation type connection structure in which a last processing part is connected to a first processing part;

a control unit that performs in parallel a sequential designation of the plurality of processing parts with respect to the plurality of decoding units; and a data storage unit including a plurality of storage devices connected in parallel with the plurality of processing parts that are provided in the plurality of decoding units, wherein the plurality of decoding units comprises a first decoding unit and a second decoding unit, and wherein the sequential designation of the plurality of processing parts with respect to the plurality of decoding units comprises designating the first decoding unit to start decoding a specified bit of the input data using the first processing part of the first decoding unit, and designating the second decoding unit to start decoding a next bit of the input data using a second processing part of the second decoding unit, said first and second processing parts being among the plurality of processing parts.

7. The decoder as claimed in claim 6, further comprising a switch unit that stores analog input data in a specific storage device of the data storage unit under the control of the control unit.

* * * * *